US012566480B2

(12) United States Patent　　　　(10) Patent No.: US 12,566,480 B2
Hsieh et al.　　　　　　　　　　　　(45) Date of Patent: *Mar. 3, 2026

(54) MOUNT BRACKET, STORAGE DEVICE ASSEMBLY, AND SERVER

(71) Applicant: Wiwynn Corporation, New Taipei City (TW)

(72) Inventors: Chia-Hsin Hsieh, New Taipei City (TW); Cyuan Lee, New Taipei City (TW); Bo-Kai Wang, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/808,323

(22) Filed: Aug. 19, 2024

(65) Prior Publication Data

US 2024/0411349 A1　　Dec. 12, 2024

Related U.S. Application Data

(62) Division of application No. 17/533,174, filed on Nov. 23, 2021, now Pat. No. 12,099,384.

(Continued)

(30) Foreign Application Priority Data

Jul. 28, 2021　(TW) ................................. 110127743

(51) Int. Cl.
　*G06F 1/18*　　　(2026.01)
　*G06F 1/187*　　(2026.01)
　　　　　(Continued)

(52) U.S. Cl.
　CPC ............ *G06F 1/187* (2013.01); *G11B 33/124* (2013.01); *G11B 33/128* (2013.01); *G06F 1/183* (2013.01); *H05K 5/023* (2013.01)

(58) Field of Classification Search
　CPC ...... G06F 1/187; G11B 33/124; G11B 33/128
　See application file for complete search history.

(56) References Cited

U.S. PATENT DOCUMENTS 6,407,913 B1　6/2002　Peachey
7,889,492 B2　2/2011　Chen
　　　　　(Continued)

FOREIGN PATENT DOCUMENTS

CN　　202870687 U　*　4/2013

*Primary Examiner* — Kimberley S Wright
(74) *Attorney, Agent, or Firm* — McClure, Qualey & Rodack, LLP

(57) ABSTRACT

A mount bracket adapted to fix a storage device to a first side plate includes a base part including first and second support portions and a handle pivotably disposed on the base part. The first support portion configured to be removably disposed on the first side plate includes separate parts spaced apart from each other and a first buffering structure having two opposite ends located between and directly connected to the separate parts along an extension direction of the first support portion. The first buffering structure is configured to abut against a positioning recess of the first side plate. The second support portion is connected to the first support portion and configured to support the storage device. An extension direction of the second support portion from the first support portion is opposite to a protrusion direction of the first buffering structure from the first support portion.

23 Claims, 18 Drawing Sheets

Related U.S. Application Data

(60) Provisional application No. 63/141,527, filed on Jan. 26, 2021.

(51) Int. Cl.
| | |
|---|---|
| _G11B 33/12_ | (2006.01) |
| _H05K 7/14_ | (2006.01) |
| _G06F 1/183_ | (2026.01) |
| _H05K 5/02_ | (2006.01) |

(56) References Cited

U.S. PATENT DOCUMENTS

| | | | |
|---|---|---|---|
| 8,050,027 | B2 | 11/2011 | Liang |
| 9,448,599 | B2 | 9/2016 | Ehlen |
| 9,823,714 | B2 | 11/2017 | Yang |
| 10,600,450 | B2 | 3/2020 | Chang |
| 11,032,933 | B2 | 6/2021 | Hu |
| 11,039,546 | B2 | 6/2021 | Wang |
| 11,114,134 | B2 | 9/2021 | Wang |
| 11,683,906 | B2 | 6/2023 | Lin |
| 2010/0103607 | A1 | 4/2010 | Chen |
| 2010/0187957 | A1 | 7/2010 | Liang |
| 2013/0127310 | A1 | 5/2013 | Yu |
| 2015/0029656 | A1 | 1/2015 | Lu |
| 2015/0293566 | A1 | 10/2015 | Ehlen |
| 2017/0188478 | A1 | 6/2017 | Wang |
| 2017/0228000 | A1 | 8/2017 | Yang |
| 2019/0075668 | A1 | 3/2019 | Adrian |
| 2020/0281086 | A1 | 9/2020 | Wang |
| 2020/0337171 | A1 | 10/2020 | Wang |
| 2020/0372938 | A1 | 11/2020 | Wang |
| 2020/0375058 | A1 | 11/2020 | Hu |
| 2022/0377928 | A1 | 11/2022 | Lin |
| 2023/0269898 | A1 | 8/2023 | Lin |

* cited by examiner

30

MOUNT BRACKET, STORAGE DEVICE ASSEMBLY, AND SERVER

CROSS-REFERENCE TO RELATED APPLICATIONS

This patent application is a divisional patent application of U.S. patent application Ser. No. 17/533,174, filed on Nov. 23, 2021 and entitled "MOUNT BRACKET, STORAGE DEVICE ASSEMBLY, AND SERVER", which is a non-provisional application claims priority under 35 U.S.C. § 119 (a) on provisional patent application No(s). 63/141,527 filed in U.S.A. on Jan. 26, 2021 and on patent application No(s). 110127743 filed in Taiwan, R.O.C. on Jul. 28, 2021, the entire contents of which are hereby incorporated by reference.

TECHNICAL FIELD

The disclosure provides a mount bracket, a storage device assembly, and a server, more particularly to a mount bracket having a buffering structure, a storage device assembly, and a server including the same.

BACKGROUND

As internet progresses, people widely use the internet to deal with daily stuffs. In order to provide better internet service, a host server is required to equip with many storage devices (e.g., hard disk drives) to store data or information. In general, interior components of the server may cause the vibrations during operation, and the server may be vibrated by exterior factors, such as impacts during the transportation and so on, but these vibrations may adversely affect the hard disk drives.

In addition, each of the storage devices is mounted in the server casing via a frame, and the frame helps the installation of the storage device into the server casing or the removal of the storage device from the server casing. During the removal of the storage device from the server casing, a handle of the frame is required to be opened and pivoted to move the storage device upward. However, after the handle is pivoted, the handle may be located above the storage device and thus interfere with the removal of the storage device. Therefore, how to prevent the handle from interfering with the removal of the storage device is one of the crucial topics in this field.

SUMMARY

The disclosure provides a mount bracket, a storage device assembly, and a server which are capable of protecting the storage device from being damaged due to vibration or sudden impact.

One embodiment of the disclosure provides a mount bracket. The mount bracket is adapted to fix a storage device to a first side plate. The mount bracket includes a base part and a handle. The base part includes a first support portion and a second support portion. The first support portion is configured to be removably disposed on the first side plate. The first support portion includes at least two separate parts that are spaced apart from each other and at least one first buffering structure. Two opposite ends of the at least one first buffering structure are located between and directly connected to the at least two separate parts of the first support portion along an extension direction of the first support portion. The at least one first buffering structure is configured to abut against at least one positioning recess of the first side plate. The second support portion is connected to the first support portion and configured to support the storage device. An extension direction of the second support portion from the first support portion is opposite to a protrusion direction of the at least one first buffering structure from the first support portion. The handle is pivotably disposed on the base part.

Another embodiment of the disclosure provides a server. The server includes a first side plate, a storage device, and a mount bracket. The first side plate has at least one positioning recess. The mount bracket includes a base part and a handle. The base part includes a first support portion and a second support portion. The first support portion is removably disposed on the first side plate. The first support portion includes at least two separate parts that are spaced apart from each other and at least one first buffering structure. Two opposite ends of the at least one first buffering structure are located between and directly connected to the at least two separate parts of the first support portion along an extension direction of the first support portion. The at least one first buffering structure abuts against the at least one positioning recess of the first side plate. The second support portion is connected to the first support portion and supports the storage device. An extension direction of the second support portion from the first support portion is opposite to a protrusion direction of the at least one first buffering structure from the first support portion. The handle is pivotably disposed on the base part.

Still another embodiment of the disclosure provides a storage device assembly. The storage device assembly is adapted to be mounted on a first side plate. The storage device assembly includes a storage device and a mount bracket. The mount bracket includes a base part and a handle. The base part includes a first support portion and a second support portion. The first support portion is configured to be removably disposed on the first side plate. The first support portion includes at least two separate parts that are spaced apart from each other and at least one first buffering structure. Two opposite ends of the at least one first buffering structure are located between and directly connected to the at least two separate parts of the first support portion along an extension direction of the first support portion. The at least one first buffering structure abuts against at least one positioning recess of the first side plate. The second support portion is connected to the first support portion and supports the storage device. An extension direction of the second support portion from the first support portion is opposite to a protrusion direction of the at least one first buffering structure from the first support portion. The handle is pivotably disposed on the base part.

According to the mount bracket, the storage device assembly, and the server as discussed in the above embodiments, when the mount bracket is mounted on the first side plate, the buffering structure is in contact with the first side plate, such that the buffering structure can reduce or absorb the vibrations or external force transmitted to the base part from the first side plate, thereby protecting the storage device from being damaged due to vibration or sudden impact.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
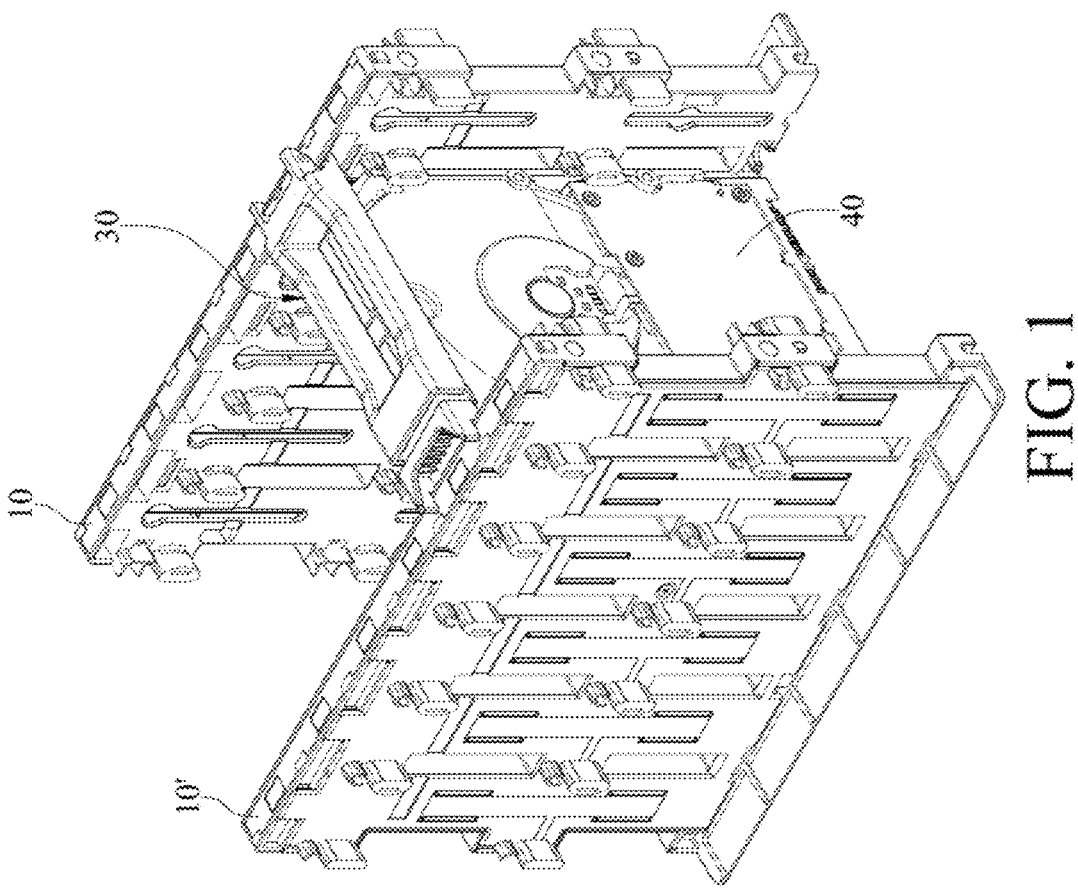
FIG. 1 is a partial perspective view of a server according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
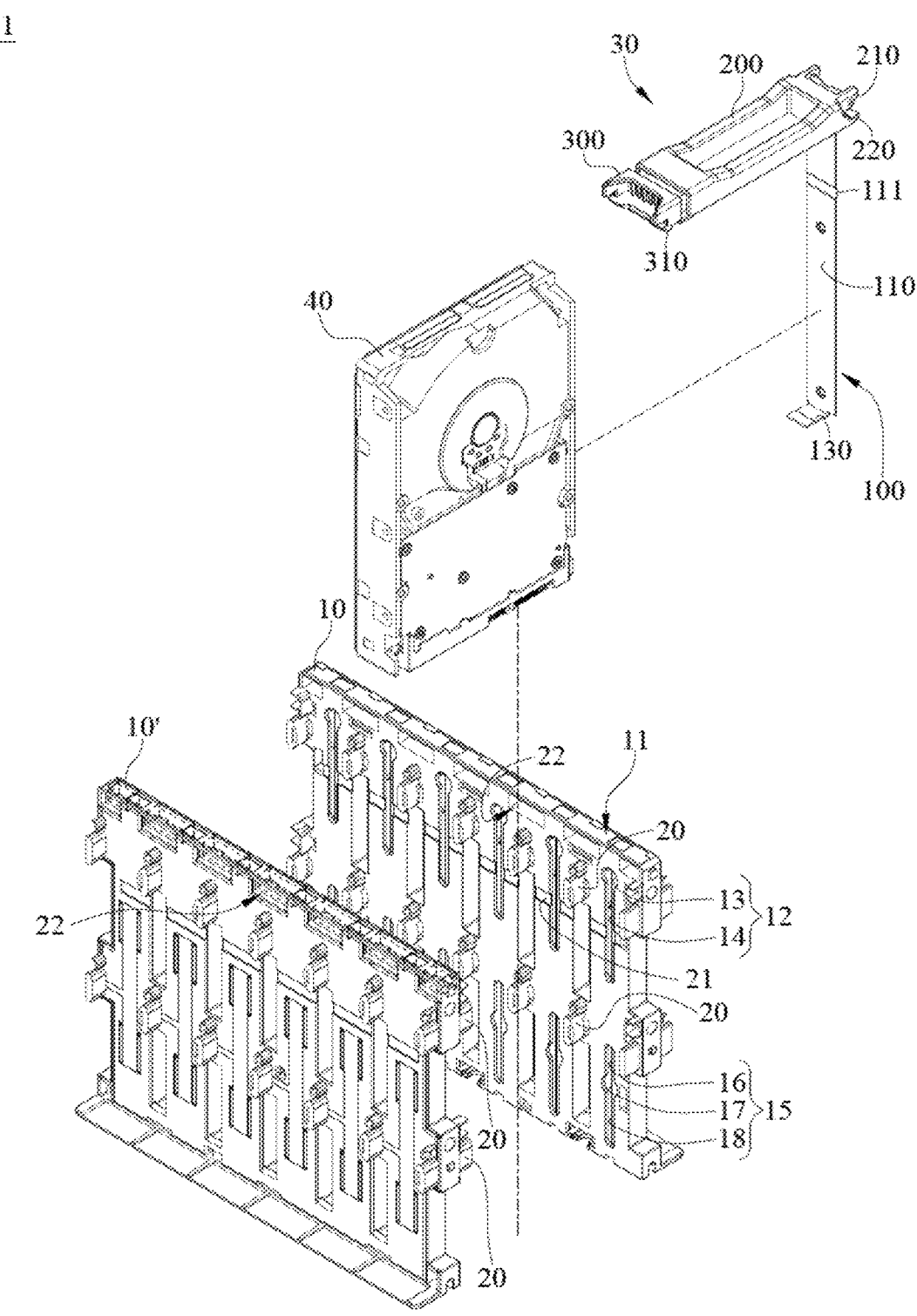
FIG. 2 is an exploded view of the server in FIG. 1.

Referring to FIGS. 1 and 2, there are shown a partial perspective view and an exploded view of a server 1 according to a first embodiment of the disclosure.

In this embodiment, the server 1 includes a first side plate 10, a second side plate 10', a mount bracket 30, and a storage device 40. Note that the server 1 may also include a casing (not shown) for accommodating other associated electronic components or devices, such as, a circuit board 50 shown in FIG. 4 or a processor, a power supply, connectors, and other components not shown in the drawings.

The first side plate 10 has a top edge 11, at least one first engagement slot 12, at least one second engagement slot 15, a plurality of guide pads 20, at least one positioning recess 21 and at least one engagement hole 22. The second side plate 10' has a plurality of guide pads 20 and at least one engagement hole 22. The first side plate 10 and the second side plate 10' are mounted on, for example, the circuit board 50, and the top edge 11 of the first side plate 10 is located opposite to the circuit board 50. The first engagement slot 12 is located closer to the top edge 11 than the second engagement slot 15. The first engagement slot 12 has a first releasing part 13 and a first fastening part 14, and the first releasing part 13 is connected to a side of the first fastening part 14 and located closer to the top edge 11 than the first fastening part 14. The second engagement slot 15 has a second releasing part 17 and two second fastening parts 16 and 18, and the second releasing part 17 is connected to and located between the second fastening parts 16 and 18. Each of the guide pads 20 may be made of rubber, plastic, or both. In one embodiment, the guide pad 20 may have a plastic core wrapped by a rubber layer. The guide pads 20 are able to guide the movement of the storage device 40 relative to the first side plate 10 and the second side plate 10' while absorb vibration or external force transmitted to the storage device 40. The positioning recess 21 is configured for positioning the mount bracket 30. The positioning recess 21 is formed by an inner bottom surface and two inner side surfaces connected to and perpendicular to the inner bottom surface.

In this embodiment, the guide pads 20 of the first side plate 10 are arranged between every first engagement slots 12 and between every second engagement slots 15, but the disclosure is not limited thereto; in some other embodiments, the guide pads of the first side plate may be arranged between every first engagement slots or the second engagement slots. Note that the quantities of the first engagement slots 12 and the second engagement slot 15 may be modified as required.

Figure 3:
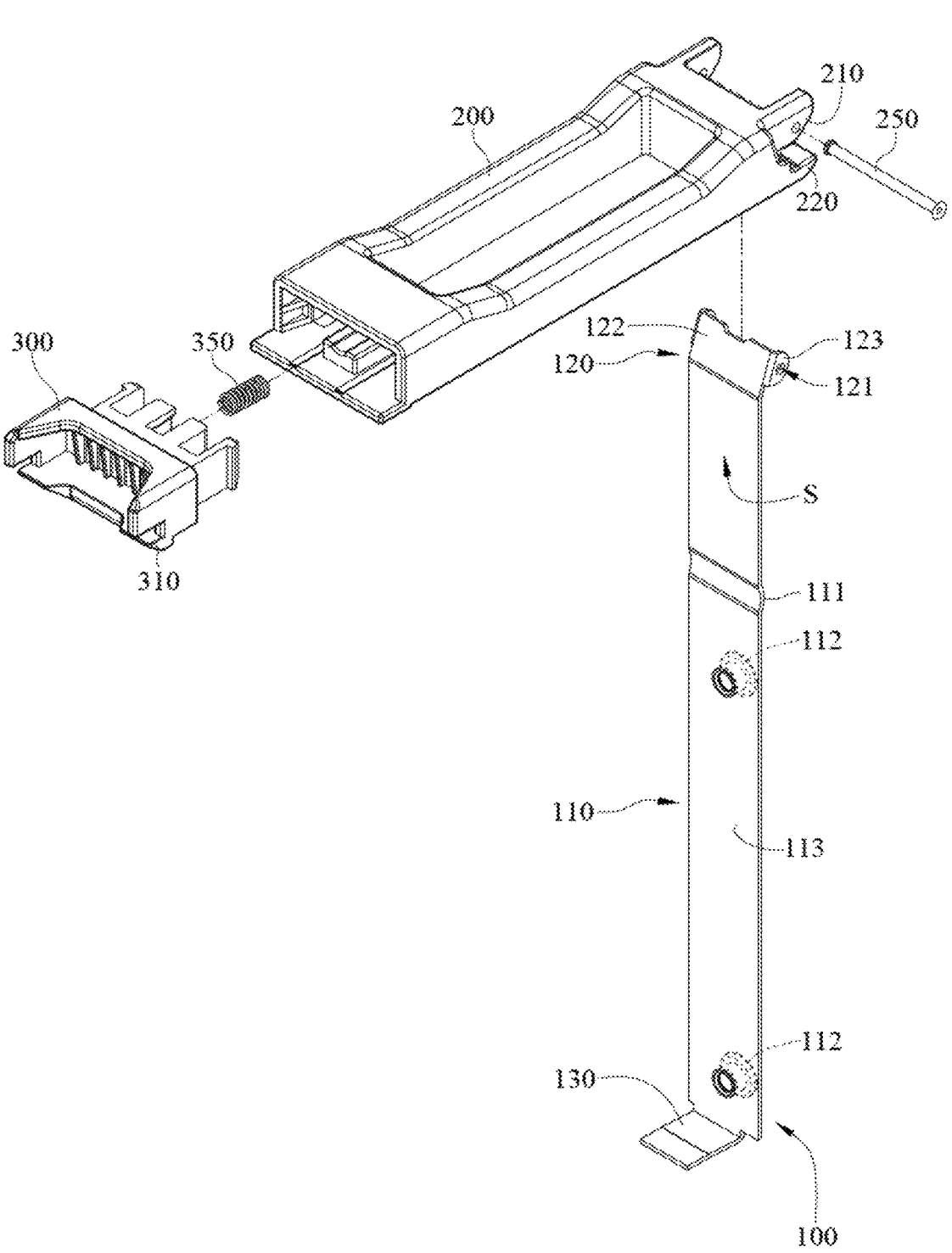
FIG. 3 is an exploded view of a mount bracket in FIG. 2.
Figure 4:
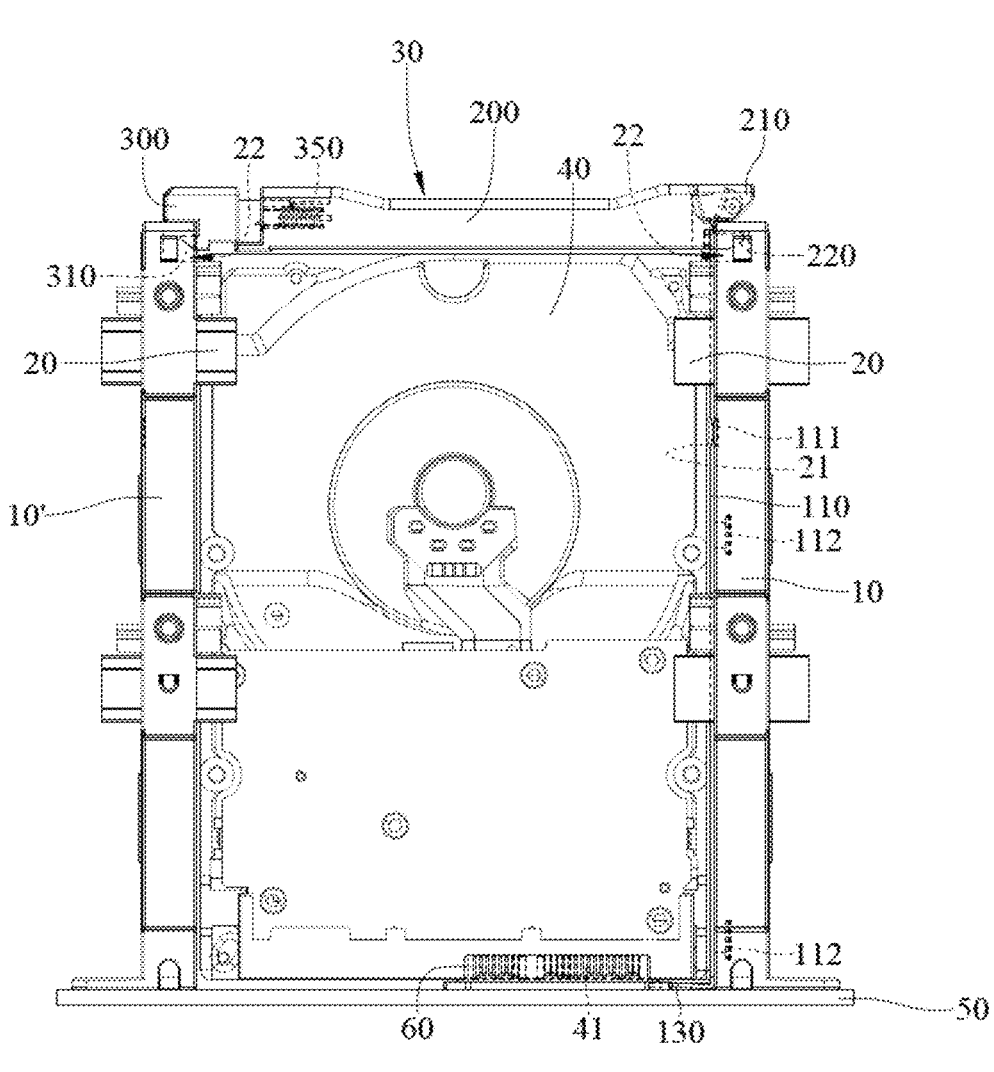
FIG. 4 is a lateral view of the server in FIG. 1.

Referring to FIGS. 2 to 4, FIG. 3 is an exploded view of a mount bracket 30 in FIG. 2, and FIG. 4 is a lateral view of the server 1 in FIG. 1.

The mount bracket 30 includes a base part 100 and a handle 200. The base part 100 is removably mounted on the first side plate 10 and is configured to support the storage device 40. Specifically, the base part 100 includes a first support portion 110 and a second support portion 130. Furthermore, the base part 100 may further include a joint portion 120.

The first support portion 110 has a surface S, a buffering structure 111, and a plate part 113. The surface S and the buffering structure 111 are located at the plate part 113. When the storage device 40 is mounted on the base part 100, the surface S faces or contacts the storage device 40. The buffering structure 111 is, for example, an elongated protrusion having a long side extending in a direction substantially perpendicular to an extension direction of the first support portion 110; that is, the buffering structure 111 may be substantially perpendicular to the extension direction of the first support portion 110. The buffering structure 111 protrudes from a surface of the plate part 113 of the first support portion 110 facing away from the surface S and towards the first side plate 10, and the buffering structure 111 is elastic. The buffering structure 111 may be formed by any suitable process, such as punching, blanking, embossing, aluminum extruding or forging.

The first support portion 110 further has two engagement protrusions 112. The engagement protrusions 112 are configured to be respectively and removably engaged with the first engagement slot 12 and the second engagement slot 15 of the first side plate 10. To install the base part 100 onto the first side plate 10, first step is to insert one of the engagement protrusions 112 into the first releasing part 13 of the first engagement slot 12, second step is to move the base part 100 towards the circuit board 50. By doing so, the other engagement protrusions 112 is moved to be aligned with the second releasing part 17 of the second engagement slot 15 and then is allowed to be inserted into the second releasing part 17. Then, fourth step is to move the base part 100 further towards the circuit board 50 until the engagement protrusions 112 touch the ends of the first engagement slot 12 and the second engagement slot 15. Through the above steps, the base part 100 is mounted on the first side plate 10. Meanwhile the buffering structure 111 of the first support portion 110 of the base part 100 is engaged into the positioning recess 21 of the first side plate10, and which helps fix the base part 100 in position and also reduce or absorb vibration or external force transmitted to the base part 100 from the first side plate 10, thereby protecting the storage device 40 from being damaged due to vibration or sudden impact. In addition, the difference in the configuration of the first engagement slot 12 and the second engagement slot 15 helps prevent the incorrect installation and unwanted removal of the base part 100.

The second support portion 130 and the joint portion 120 are respectively connected to two opposite ends of the first support portion 110. The second support portion 130 is, for example, in a plate shape and is non-parallel to the plate part 113 of the first support portion 110. The second support portion 130 is configured to support or hold the storage device 40 in position on the mount bracket 30.

The joint portion 120 has a plate part 122. The plate part 122 of the joint portion 120 is non-parallel to the plate part 113 of the first support portion 110. The joint portion 120 and the second support portion 130 are respectively located at two opposite ends of the first support portion 110, and the joint portion 120 and the second support portion 130 are respectively located at two opposite sides of the first support portion 110 in a thickness direction T1 of the first support portion 110. The joint portion 120 further has a tab part 123 and a mount hole 121 located at the tab part 123.

The handle 200 has a pressing portion 210 and an engagement portion 220 located at one side of the handle 200. The pressing portion 210 is pivotably disposed on the tab part 123 of the joint portion 120 via a pivot (not numbered) inserting therethrough. The pressing portion 210 is configured to press against the first side plate 10 to move the base part 100 relative to the first side plate 10. The engagement portion 220 is configured to be engaged with the engagement hole 22 of the first side plate 10.

In this embodiment, the mount bracket 30 may further include a latch 300 and an elastic component 350. The latch 300 is movably mounted on the handle 200 and located opposite to the engagement portion 220. The latch 300 has an engagement portion 310. The engagement portion 310 is configured to engaged with the engagement hole 22 of the second side plate 10'. The elastic component 350 is, for example, a compression spring. The elastic component 350 is located between and clamped by the latch 300 and the handle 200. The elastic component 350 is configured to force the engagement portion 310 of the latch 300 to insert into the engagement hole 22 of the second side plate 10'.

Figure 5:
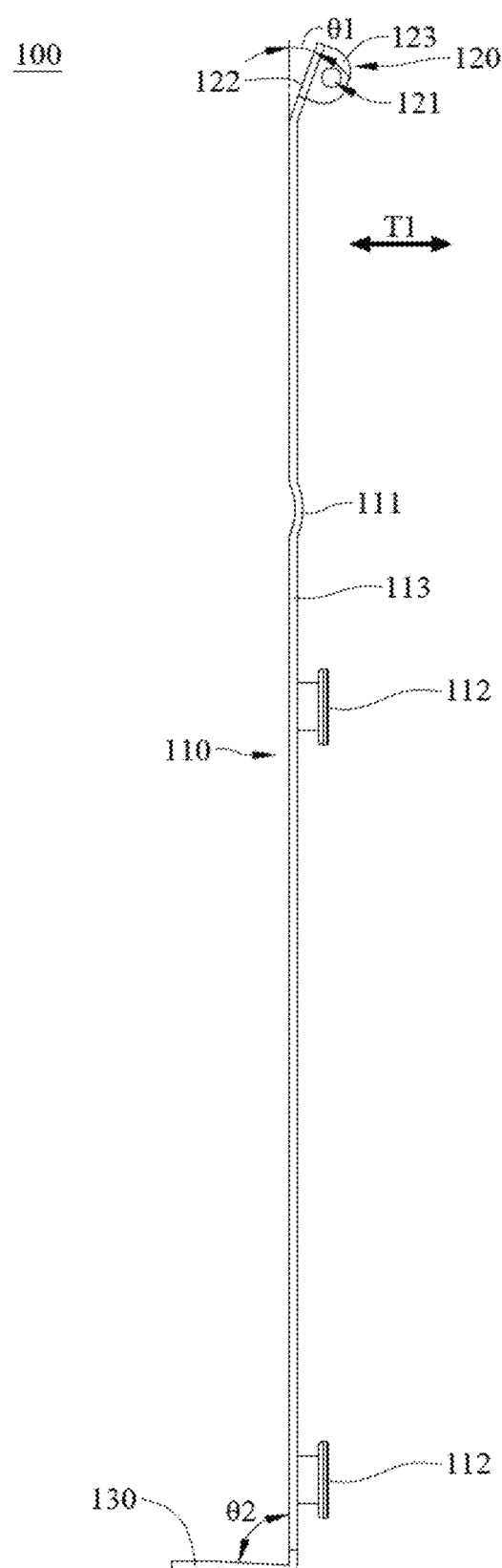
FIG. 5 is a schematic view of a base part in FIG. 4.
Figure 6:
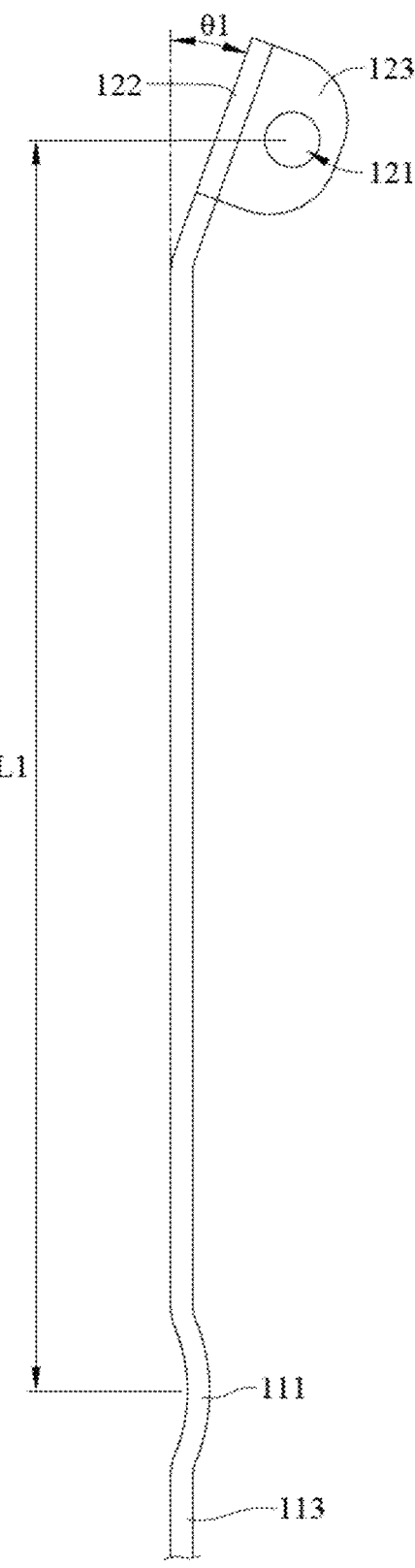
FIG. 6 is a partial and enlarged schematic view of the base part in FIG. 5.
Figure 7:
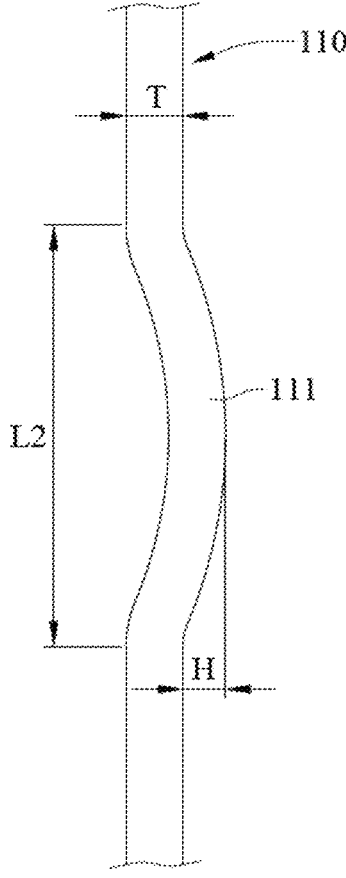
FIG. 7 is a partial and enlarged schematic view of the base part in FIG. 6.

Referring to FIGS. 5 to 7, there are shown a schematic view of the base part 100 in FIG. 4, a partial and enlarged schematic view of the base part 100 in FIG. 5, and a partial and enlarged schematic view of the base part 100 in FIG. 6.

In this embodiment, as long as the pressing portion 210 and the engagement portion 220 does not interfere with the installation and the removal of the storage device 40, an angle θ1 between the plate part 122 of the joint portion 120 and the extension direction of the first support portion 110 can be determined by the sizes of the pressing portion 210 and the engagement portion 220. The larger the sizes of the pressing portion 210 and the engagement portion 220, the larger the angle θ1 is. In contrast, the smaller the sizes of the pressing portion 210 and the engagement portion 220, the smaller the angle θ1 is. In one embodiment, the angle θ1 may range between 10 degrees and 45 degrees. In this embodiment, the angle of the joint portion 120 to the first support portion 110 can provide a buffering effect.

In addition, in the extension direction of the first support portion 110, a distance between the mount hole 121 of the joint portion 120 and a center point of the buffering structure 111 denotes L1; in the thickness direction T1, a height of the buffering structure 111 relative to the flat surface of the plate part 113 of the first support portion 110 denotes H; in the extension direction of the first support portion 110, a length of the buffering structure 111 denotes L2; and a thickness of the first support portion 110 denotes T. It is noted that L1, H, L2, and T all may be modified according to anti-vibration required by the storage device 40.

Referring to FIGS. 8 to 14, the removal process of the storage device 40 is given below in detail.

Figure 8:
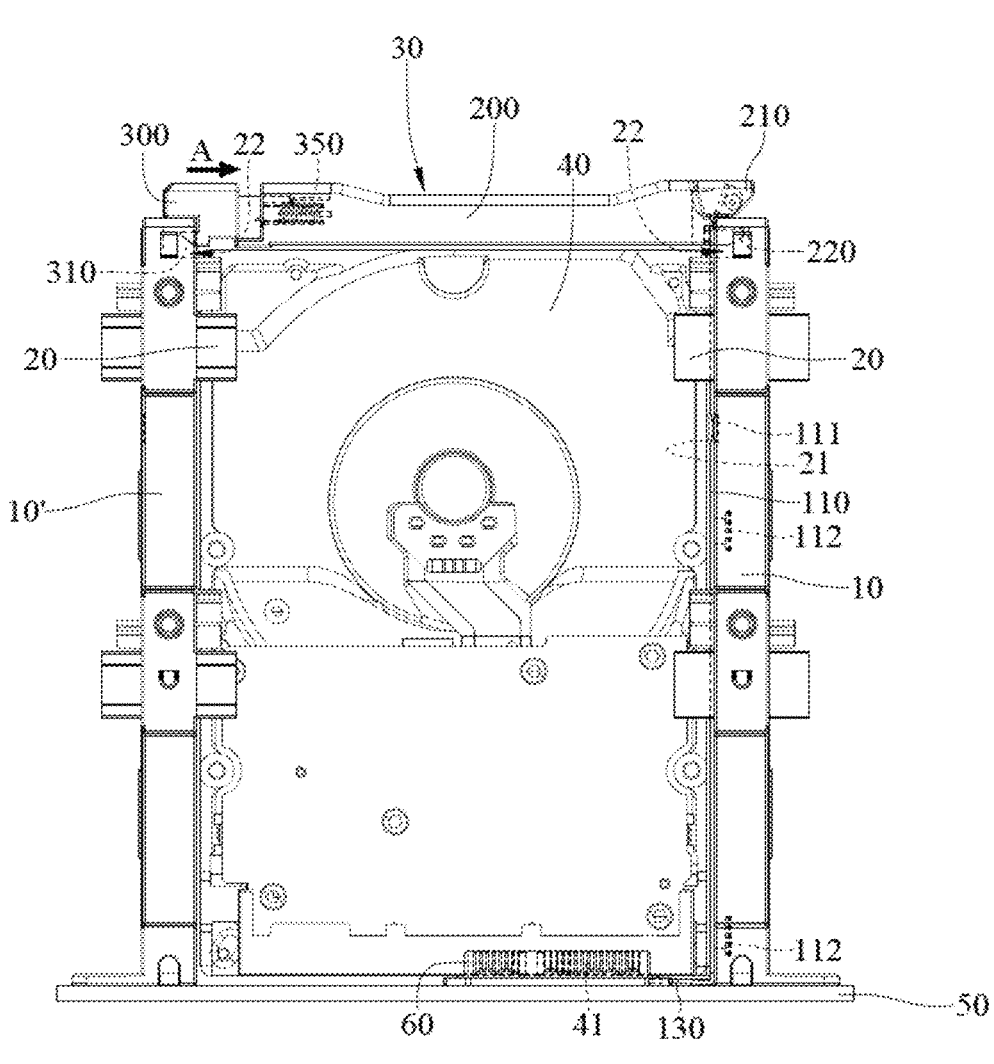
FIGS. 8 to 14 show a removal process of the storage device in FIG. 1.
Figure 9:
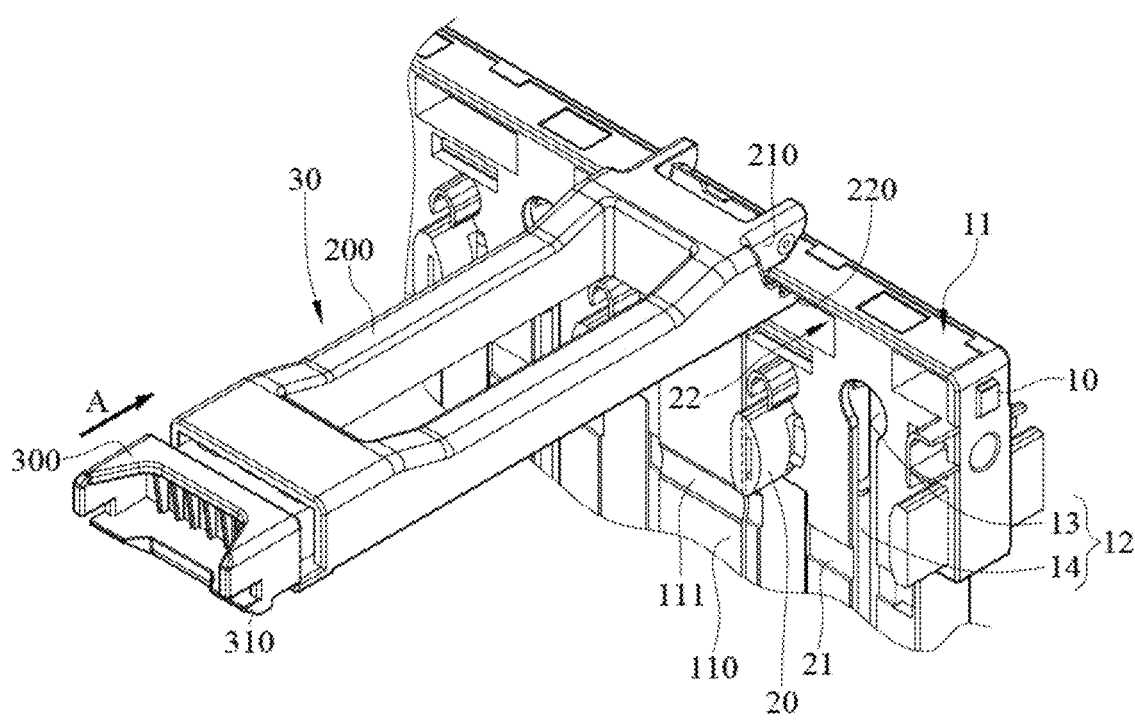

As shown in FIGS. 8 and 9, the storage device 40 is mounted on the first side plate 10 via the mount bracket 30, and a connector 41 of the storage device 40 is electrically connected to a connector 60 of the circuit board 50. Also, the engagement portion 220 of the handle 200 and the engagement portion 310 of the latch 300 are respectively engaged with the engagement holes 22 of the first side plate 10 and the second side plate 10'. At this moment, the handle 200 is in a closed position, and the mount bracket 30 are fixed to the first side plate 10 and the second side plate 10'.

Meanwhile, the base part 100 is mounted on the first side plate 10, and the buffering structure 111 of the base part 100 is engaged into the positioning recess 21 of the first side plate 10, which fixes the base part 100 in position and the elasticity of the buffering structure 111 can also reduce or absorb vibration or external force transmitted to the base part 100 from the first side plate 10.

Figure 10:
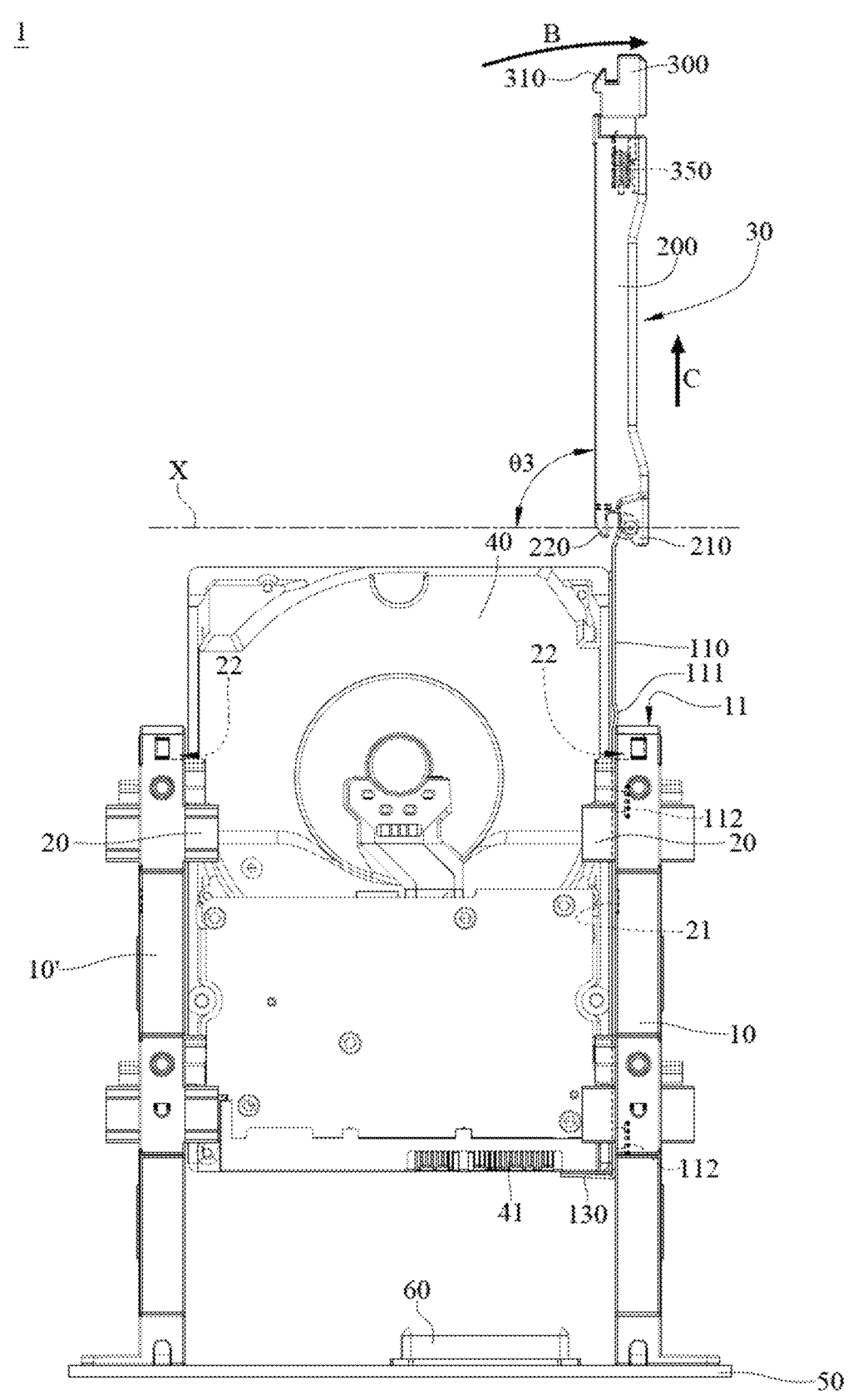
Figure 11:
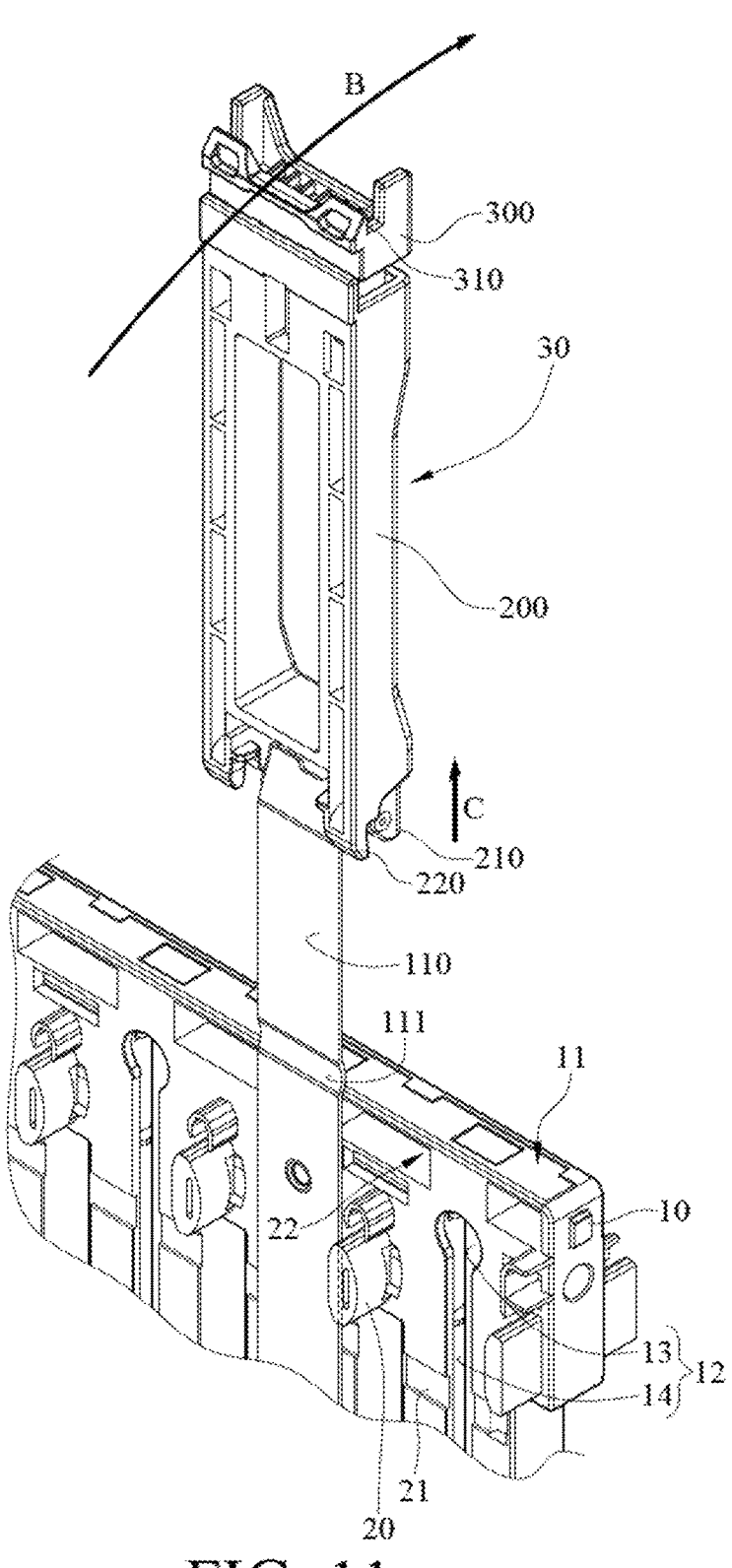

To remove the storage device 40 out of the mount bracket 30, the first step is to push the latch 300 (as indicated by an arrow A) to release the engagement portion 310 from the engagement hole 22 of the second side plate 10'. Then, as shown in FIGS. 10 and 11, the second step is to pivot the handle 200 to an opened position (as indicated by an arrow B). The handle 200 may be pivoted by an angle θ3 (e.g., approximately 90 degrees) from the closed position to be approximately perpendicular to a reference line X of the handle 200 in the closed position. While pivoting the handle 200, the pressing portion 210 of the handle 200 presses against the top edge 11 of the first side plate 10, which forces the storage device 40 and the mount bracket 30 itself upwards by a short distance, causing the connector 41 of the storage device 40 to disengage from the connector 60 of the circuit board 50. Then, the third step is to pull the handle 200 of the mount bracket 30 further upwards (as indicated by an arrow C), the lower edge of the buffering structure 111 of the first support portion 110 is in contact with the top edge 11 of the first side plate 10. At this moment, as shown in FIG. 10, the mount bracket 30 is kept in the current position as the buffering structure 111 sits on the top edge 11 of the first side plate 10, so that the storage device 40 can be held above the circuit board 50 without manually holding it.

Figure 12:
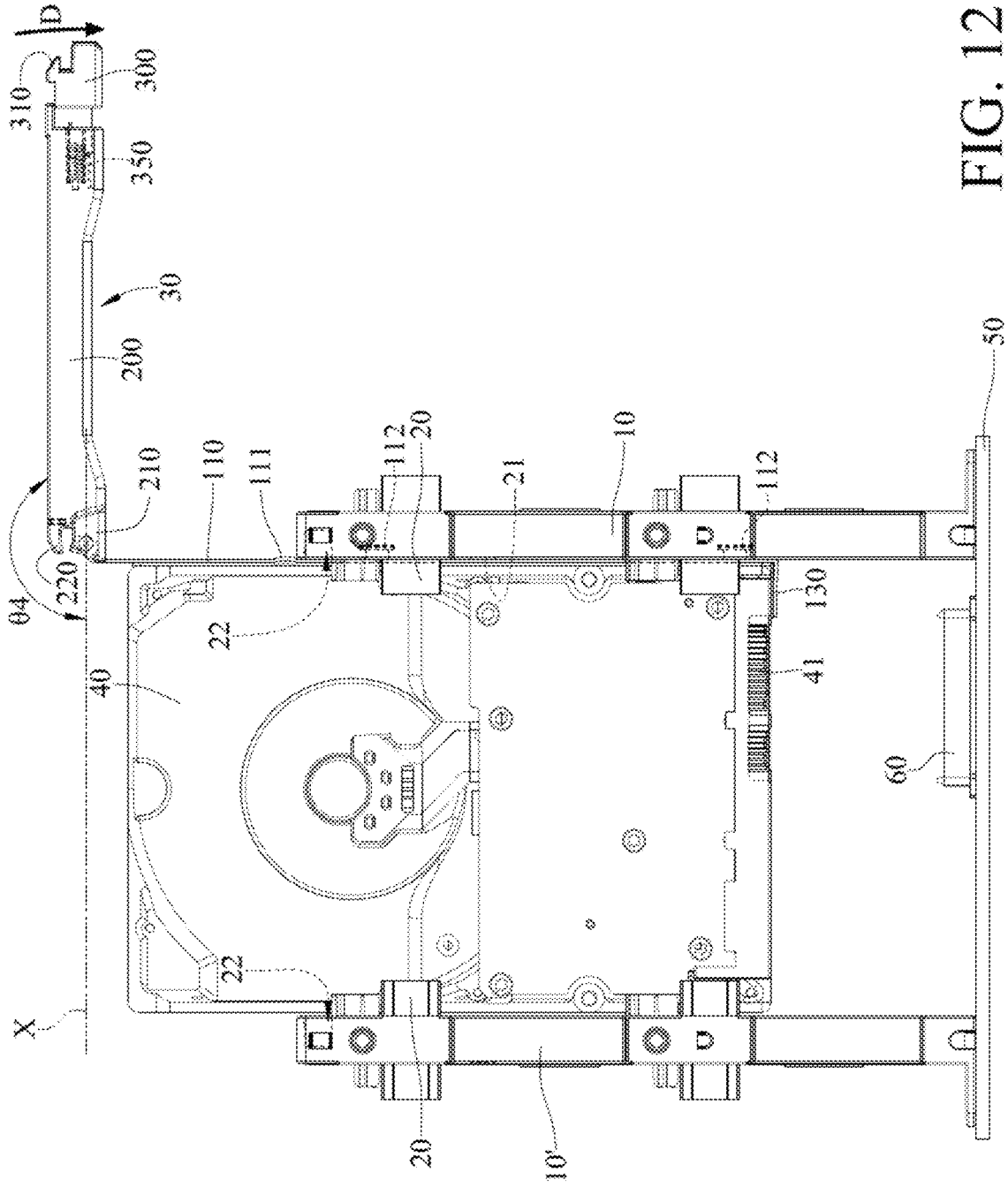
Figure 13:
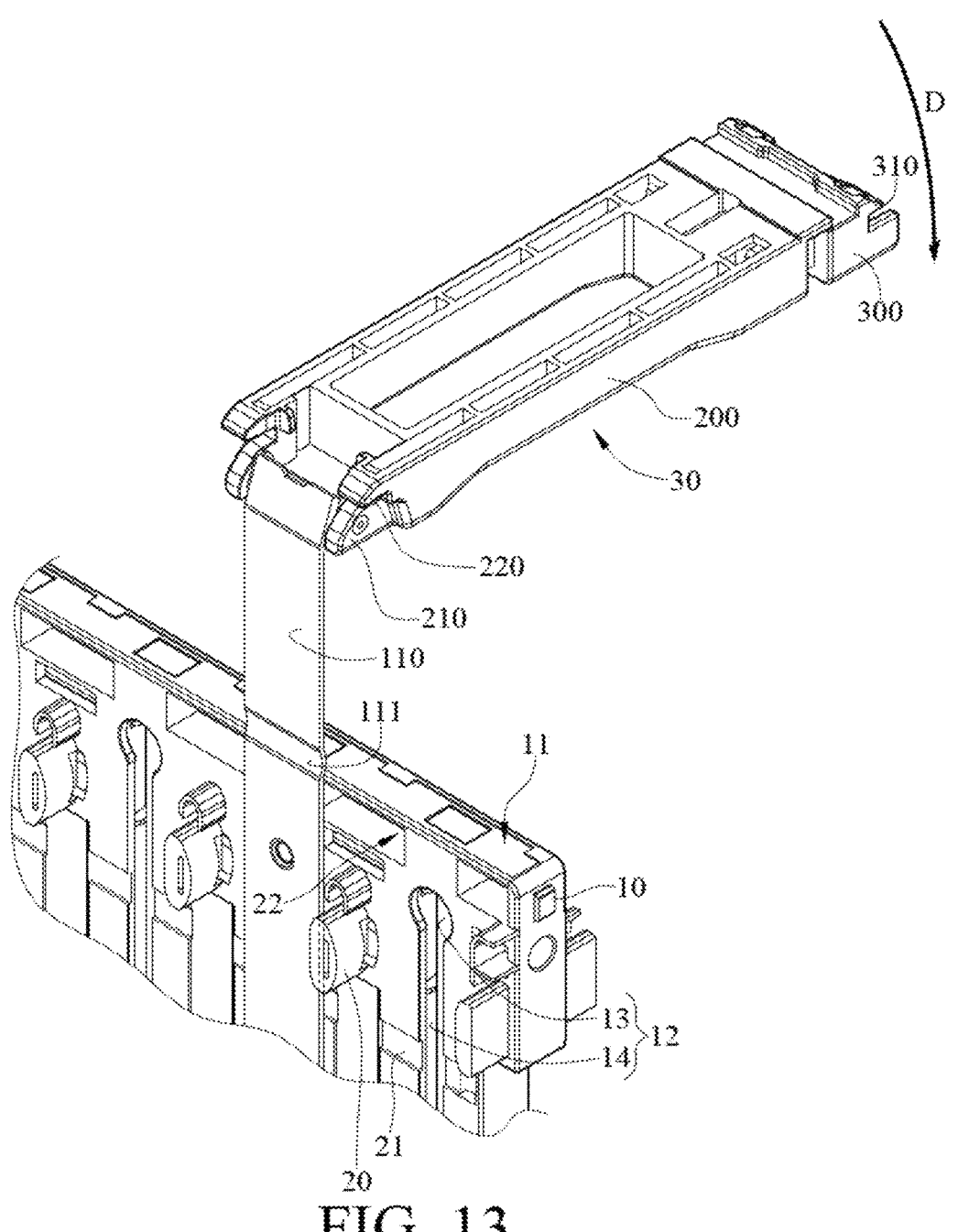
Figure 14:
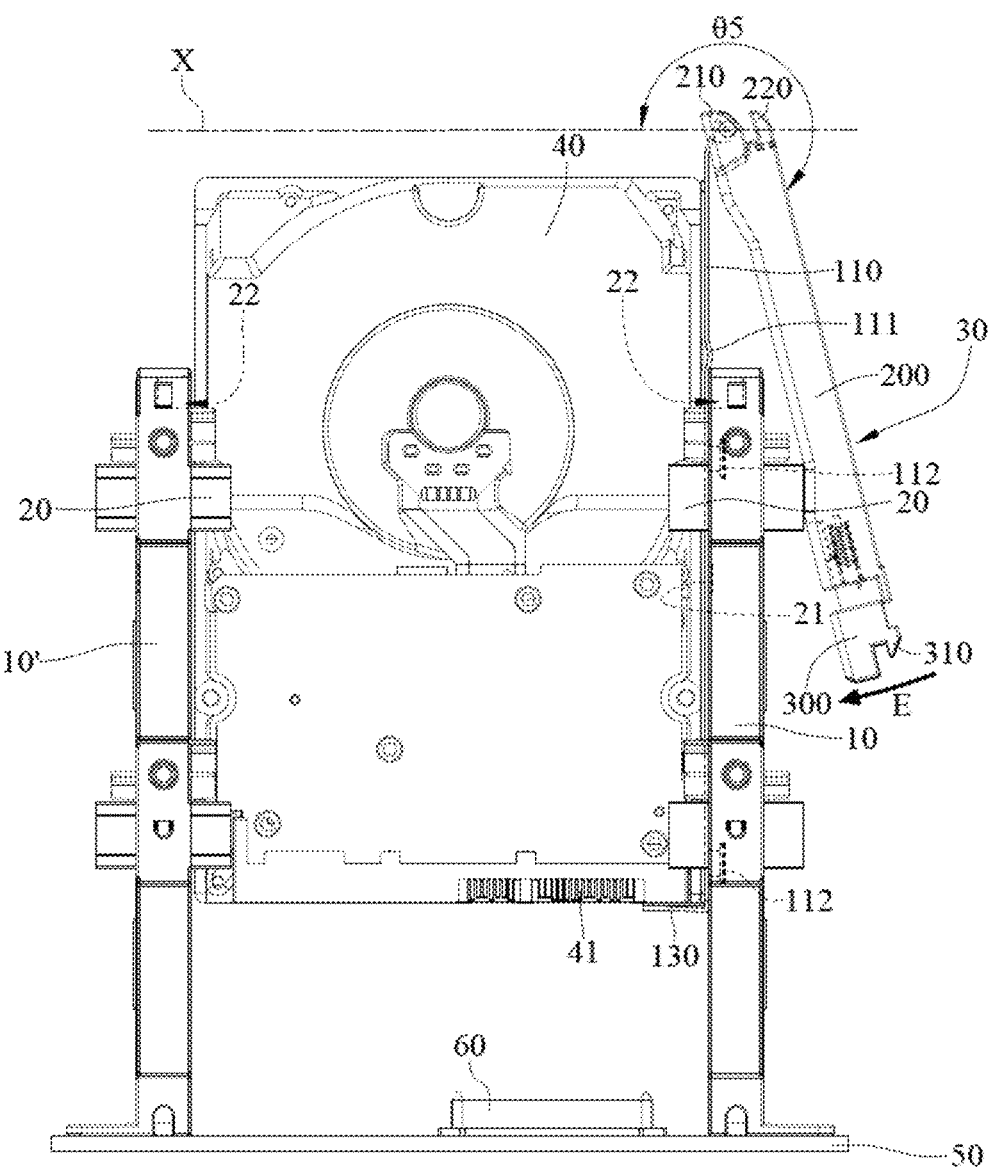

When the handle 200 is in a position at an angle of approximately 90 degrees to its closed position, the engagement portion 220 may be located at the path for removing the storage device 40. In this case, the inclination of the joint portion 120 allows the handle 200 to further pivot to avoid the engagement portion 220 from blocking the storage device 40. Specifically, as shown in FIGS. 12 and 13, after the handle 200 is further pivoted (as indicated by an arrow D), the handle 200 will be at an angle θ4 of approximately 180 degrees to its closed position so as to be in parallel to the reference line X. By doing so, the engagement portion 220 of the handle 200 is moved out of the removal path of the storage device 40, thus the handle 200 is prevented from interfering with the storage device 40 during the removal of the storage device 40 from the mount bracket 30. As shown in FIG. 14, the handle 200 may be allowed to be further pivoted (as indicated by an arrow E) so as to be at an angle θ5 larger than 180 degrees to its closed position; that is, the handle 200 will be at an angle θ5 larger than 180 degrees to the reference line X.

Note that, in the disclosure, by modifying the configurations of the base part 100 and the handle 200, the released handle 200 may have a pivotable range of around 0 to 270 degrees from the closed position.

In this embodiment, the mount bracket 30 and the storage device 40 mounted on the mount bracket 30 can be regarded as a storage device assembly. Note that the storage device assembly may be applicable to other types of electronic devices or systems.

Figure 15:
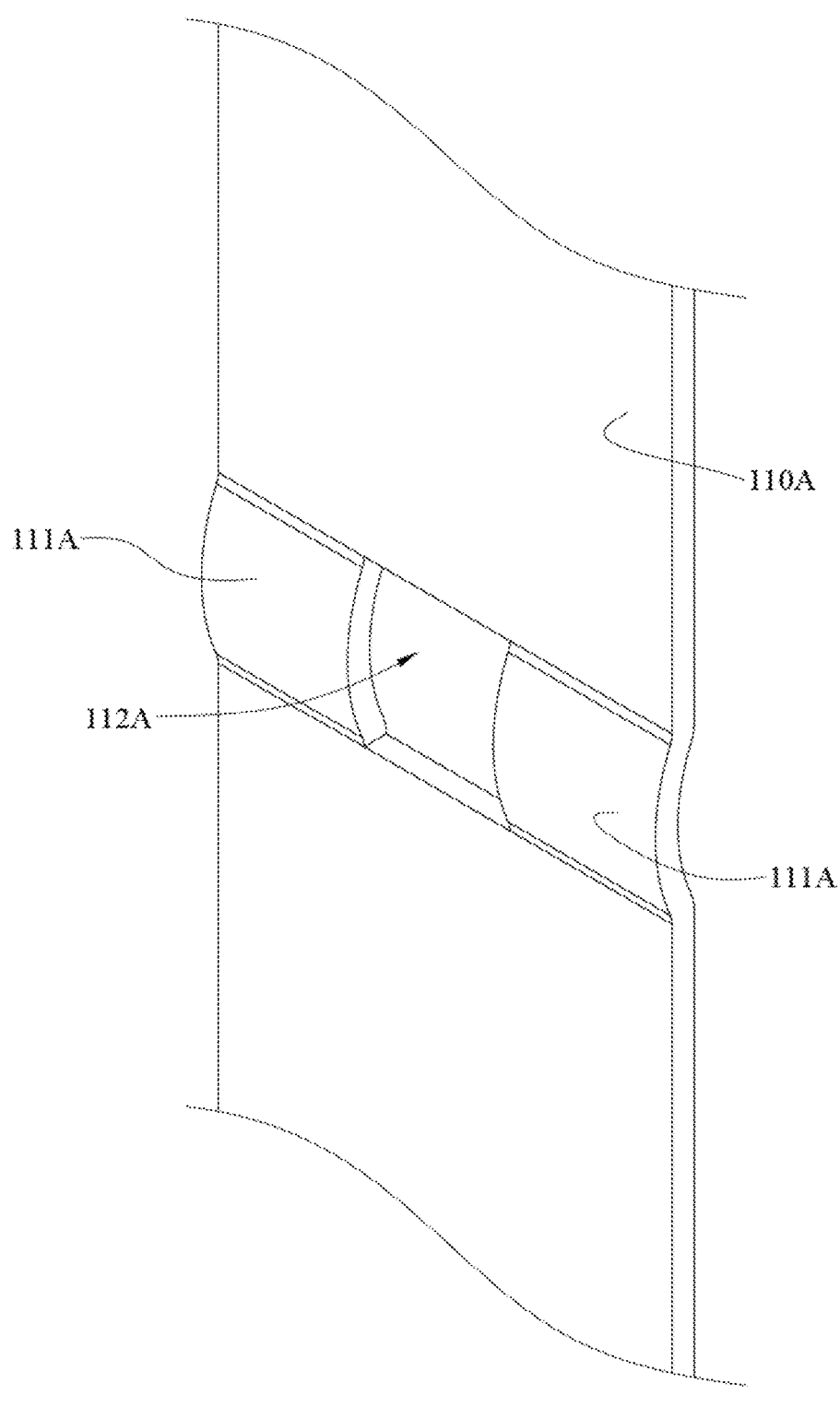
FIG. 15 is a partial and enlarged perspective view of a first support portion according to a second embodiment of the disclosure.

Referring to FIG. 15, there is shown a partial and enlarged perspective view of a first support portion 110A according to a second embodiment of the disclosure.

In this embodiment, the first support portion 110A has two buffering structure 111A and a through hole 112A formed between the buffering structures 111A.

Figure 16:
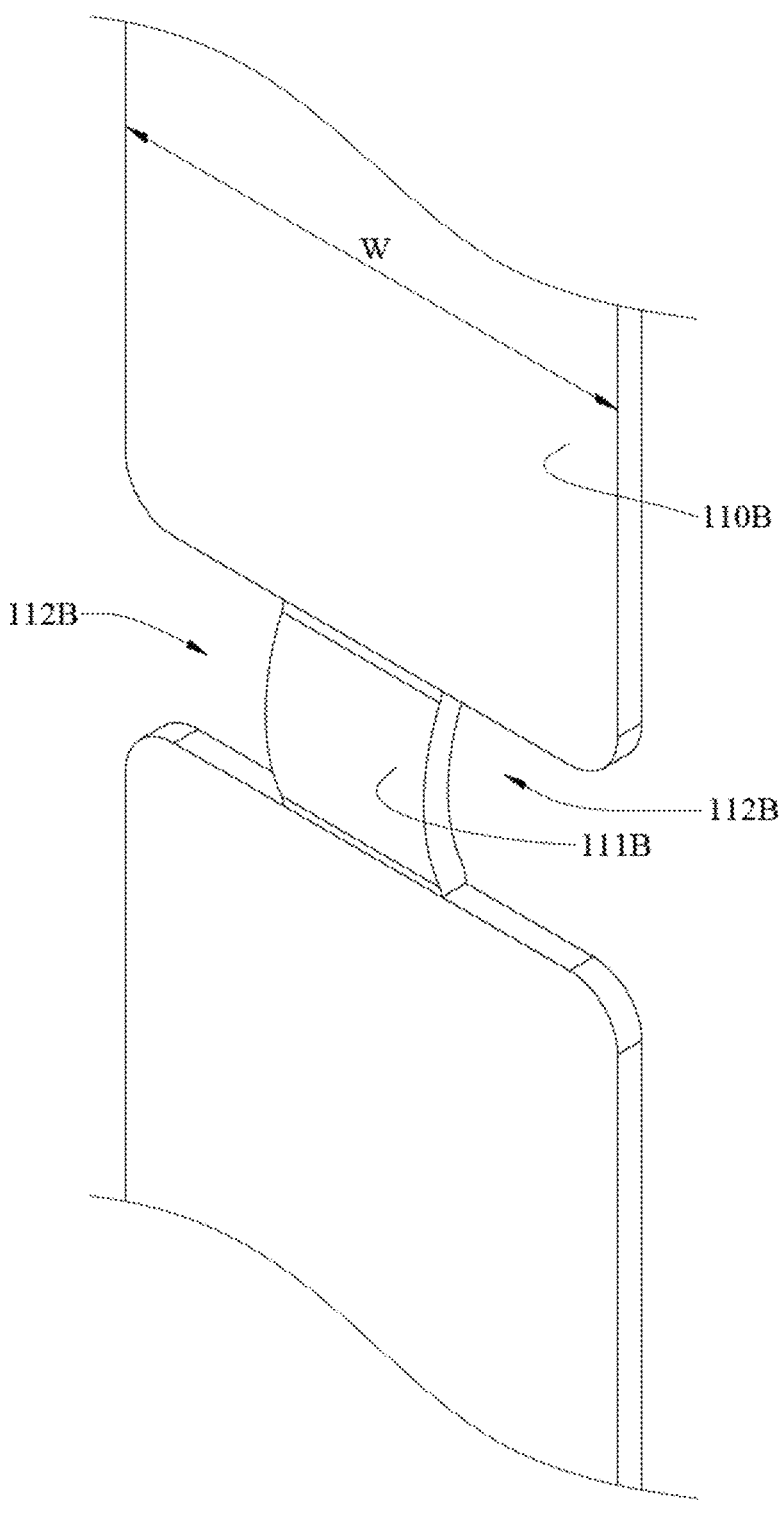
FIG. 16 is a partial and enlarged perspective view of a first support portion according to a third embodiment of the disclosure.

As shown in FIG. 16, there is shown a partial and enlarged perspective view of a first support portion 110B according to a third embodiment of the disclosure.

In this embodiment, the first support portion 110B has a buffering structure 111B and two through holes 112B. The buffering structure 111B is a protrusion. The through holes 112B are located at two opposite sides of the buffering structure 111B. An overall width of the buffering structure 111B and the through holes 112B is substantially equal to a width W of the first support portion 110B.

Figure 17:
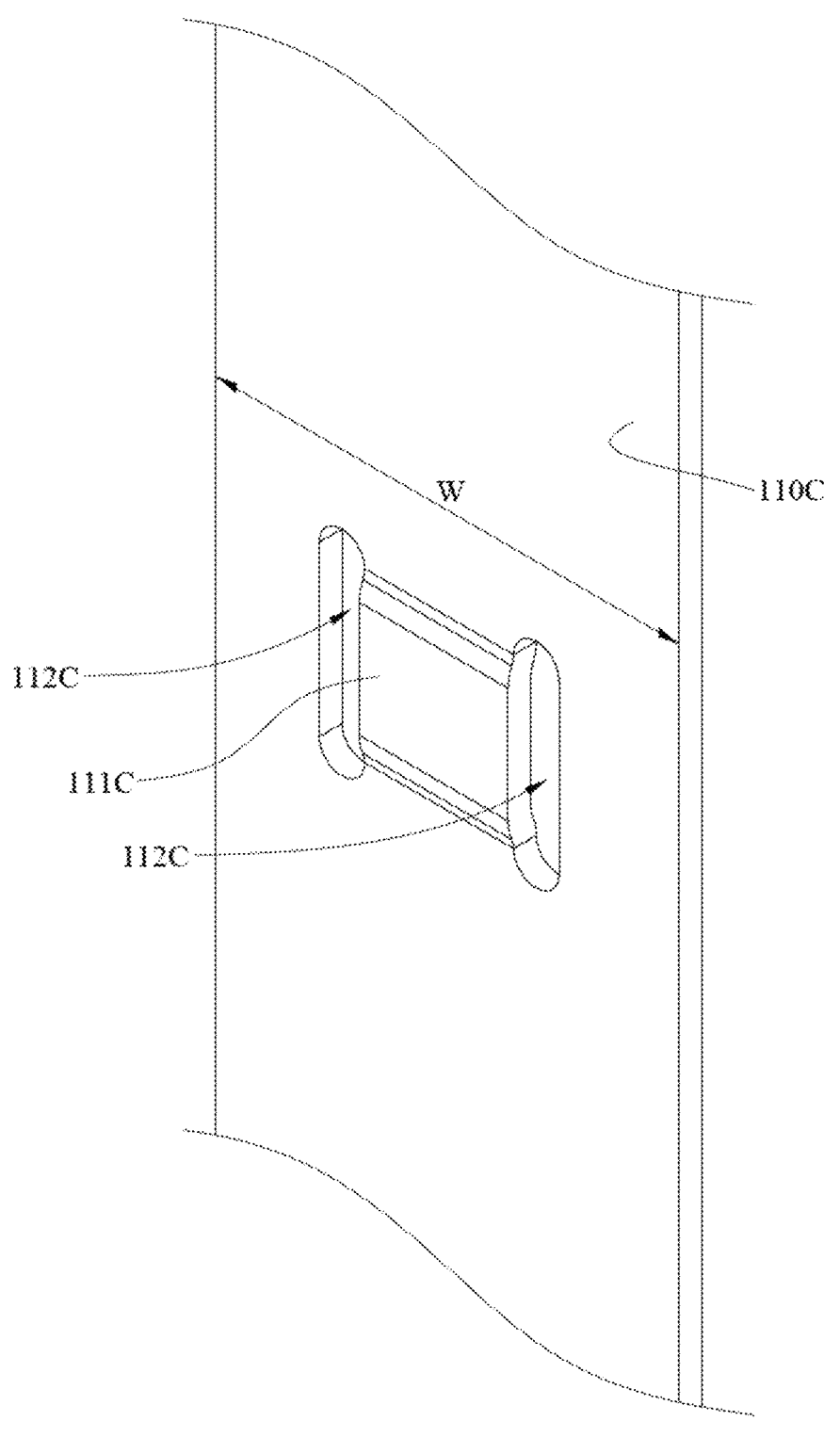
FIG. 17 is a partial and enlarged perspective view of a first support portion according to a fourth embodiment of the disclosure.

Referring to FIG. 17, there is shown a partial and enlarged perspective view of a first support portion 110C according to a fourth embodiment of the disclosure.

In this embodiment, the first support portion 110C has a buffering structure 111C and two through holes 112C. The buffering structure 111C is a protrusion. The buffering structure 111C is located between the through holes 112C. An overall width of the buffering structure 111C and the through holes 112C is smaller than a width W of the first support portion 110C.

Figure 18:
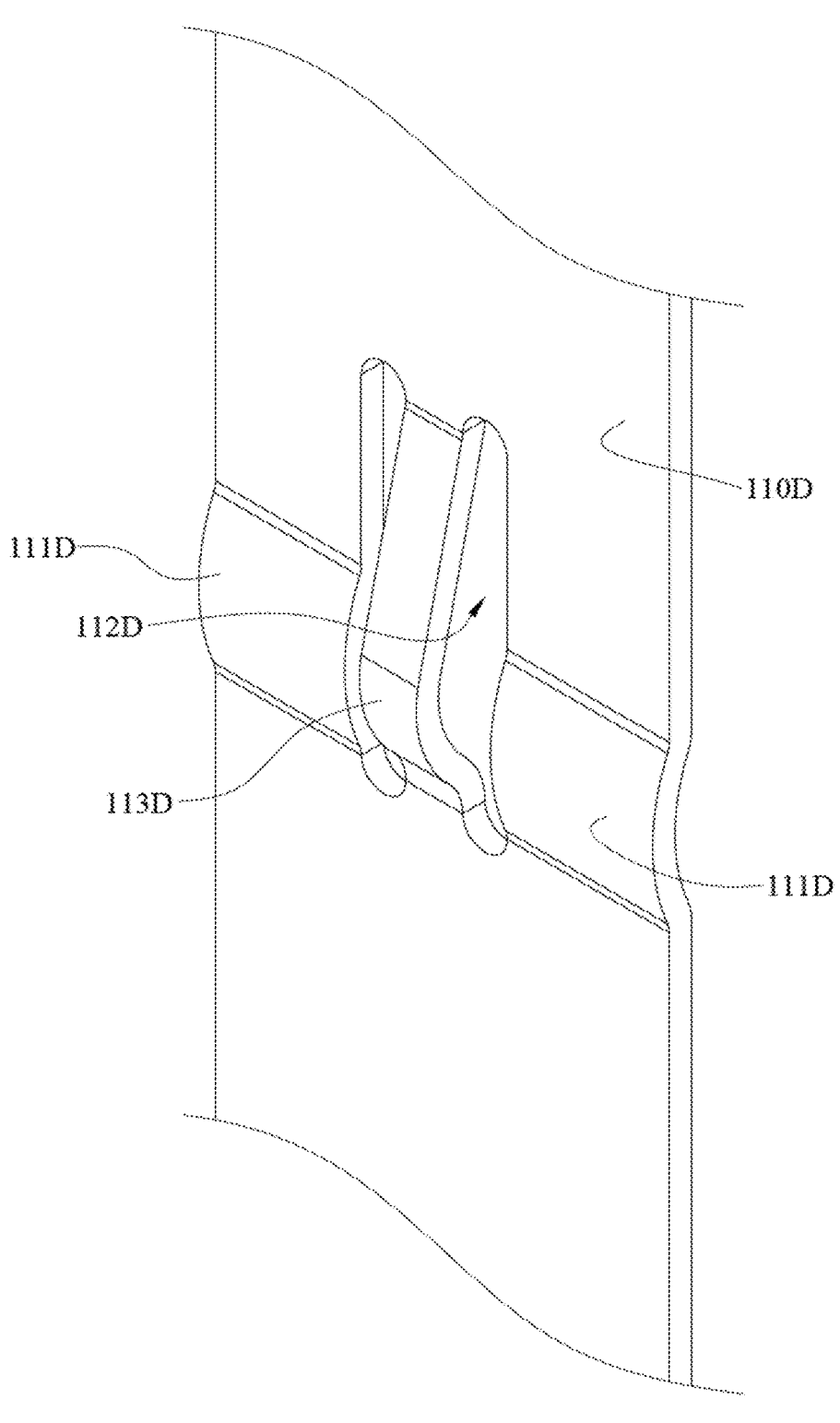
FIG. 18 is a partial and enlarged perspective view of a first support portion according to a fifth embodiment of the disclosure.

Referring to FIG. 18, there is shown a partial and enlarged perspective view of a first support portion 110D according to a fifth embodiment of the disclosure.

In this embodiment, the first support portion 110D has two first buffering structures 111D, a second buffering structure 113D, and a through hole 112D. The first buffering structures 111D are protrusions. The through hole 112D is formed between the first buffering structures 111D. The second buffering structure 113D is located at the through hole 112D, and the second buffering structure 113D further protrudes from a surface of the first support portion 110D than the first buffering structures 111D. The second buffering structure 113D may have an inclined part so as to facilitate a tactile feedback while operating the mount bracket.

According to the mount bracket, the storage device assembly, and the server as discussed in the above embodiments, when the mount bracket is mounted on the first side plate, the buffering structure is in contact with the first side plate, such that the buffering structure can reduce or absorb the vibrations or external force transmitted to the base part from the first side plate, thereby protecting the storage device from being damaged due to vibration or sudden impact.

In addition, the inclined joint portion can increase the pivotable range of the handle, such that the engagement portion of the handle can be moved out of the path for removing the storage device, thereby preventing the handle from interfering with the storage device during the removal of the storage device from the mount bracket.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A mount bracket, adapted to fix a storage device to a first side plate, comprising:
   a base part, comprising:
   a first support portion, configured to be removably disposed on the first side plate, wherein the first support portion comprises at least two separate parts that are spaced apart from each other and at least one first buffering structure, two opposite ends of the at least one first buffering structure are located between and directly connected to the at least two separate parts of the first support portion along an extension direction of the first support portion, wherein the first side plate has at least one positioning recess, the at least one positioning recess is recessed from a surface of the first side plate facing the mount bracket, and the at least one first buffering structure is configured to be engaged with the at least one positioning recess of the first side plate; and
   a second support portion, connected to the first support portion and configured to support the storage device, wherein an extension direction of the second support portion from the first support portion is opposite to a protrusion direction of the at least one first buffering structure from the first support portion; and
   a handle, pivotably disposed on the base part.

2. The mount bracket according to claim 1, wherein the at least one first buffering structure is a protrusion towards the first side plate.

3. The mount bracket according to claim 2, wherein the at least one first buffering structure is in an elongated shape, and the at least one first buffering structure extends in a direction which is substantially perpendicular to the extension direction of the first support portion.

4. The mount bracket according to claim 1, wherein the at least one first buffering structure comprises two first buffering structures which are protrusions, and the first support portion further has a through hole formed between the first buffering structures.

5. The mount bracket according to claim 4, wherein the first support portion further has a second buffering structure located at the through hole.

6. The mount bracket according to claim 5, wherein the second buffering structure further protrudes from a surface of the first support portion than the first buffering structures.

7. The mount bracket according to claim 1, wherein the at least one first buffering structure is a protrusion, and the first support portion further has two through holes located at two opposite sides of the at least one first buffering structure.

8. The mount bracket according to claim 7, wherein an overall width of the at least one first buffering structure and the through holes is smaller than a width of the first support portion.

9. The mount bracket according to claim 1, wherein the base part further comprises a joint portion, the joint portion and the second support portion are respectively connected to two opposite ends of the first support portion, the joint portion has a plate part, the first support portion has a plate part, and the plate part of the joint portion is non-parallel to the plate part of the first support portion.

10. The mount bracket according to claim 9, wherein the plate part of the joint portion is at an angle to the plate part of the first support portion, and the angle ranges between 10 degrees and 45 degrees.

11. The mount bracket according to claim 10, wherein the handle has a pressing portion and an engagement portion, the pressing portion is pivotably disposed on the joint portion of the base part and configured to press against the first side plate to move the base part relative to the first side plate, and the engagement portion is configured to be engaged with the first side plate.

12. The mount bracket according to claim 11, further comprising a latch and an elastic component, wherein the latch is mounted on a side of the handle located away from the engagement portion and configured to be engaged with a second side plate, and the elastic component is located between and clamped by the latch and the handle.

13. The mount bracket according to claim 1, wherein the handle has a pivotable range of 0 to 270 degrees from a closed position; when the handle is in the closed position, the handle is engaged with the first side plate.

14. A server, comprising:
a first side plate having at least one positioning recess;
a storage device; and
a mount bracket, comprising:
    a base part, comprising:
        a first support portion, removably disposed on the first side plate, wherein the first support portion comprises at least two separate parts that are spaced apart from each other and at least one first buffering structure, two opposite ends of the at least one first buffering structure are located between and directly connected to the at least two separate parts of the first support portion along an extension direction of the first support portion, wherein the at least one positioning recess is recessed from a surface of the first side plate facing the mount bracket, and the at least one first buffering structure is engaged with the at least one positioning recess of the first side plate; and
        a second support portion, connected to the first support portion and supporting the storage device, wherein an extension direction of the second support portion from the first support portion is opposite to a protrusion direction of the at least one first buffering structure from the first support portion; and
    a handle, pivotably disposed on the base part.

15. The server according to claim 14, wherein the first side plate has two engagement slots, the first support portion has two engagement protrusions, and the engagement protrusions are respectively engaged with the engagement slots of the first side plate.

16. The server according to claim 15, wherein the engagement slots are respectively a first engagement slot and a second engagement slot, the first engagement slot has a first releasing part and a first fastening part, the first releasing part is connected to a side of the first fastening part, the second engagement slot has a second releasing part and two second fastening parts, and the second releasing part is located between and connected to the second fastening parts.

17. The server according to claim 14, wherein the at least one first buffering structure is in an elongated shape, and the at least one first buffering structure extends in a direction which is substantially perpendicular to the extension direction of the first support portion.

18. The server according to claim 14, wherein the at least one first buffering structure comprises two first buffering structures which are protrusions, and the first support portion further has a through hole formed between the first buffering structures.

19. The server according to claim 14, wherein the at least one first buffering structure is a protrusion, and the first support portion further has two through holes located at two opposite sides of the at least one first buffering structure.

20. A storage device assembly, adapted to be mounted on a first side plate, comprising:
a storage device; and
a mount bracket, comprising:
    a base part, comprising:
        a first support portion, configured to be removably disposed on the first side plate, wherein the first support portion comprises at least two separate parts that are spaced apart from each other and at least one first buffering structure, two opposite ends of the at least one first buffering structure are located between and directly connected to the at least two separate parts of the first support portion along an extension direction of the first support portion, wherein the first side plate has at least one positioning recess, the at least one positioning recess is recessed from a surface of the first side plate facing the mount bracket, and the at least one first buffering structure is engaged with the at least one positioning recess of the first side plate; and
        a second support portion, connected to the first support portion and supporting the storage device, wherein an extension direction of the second support portion from the first support portion is opposite to a protrusion direction of the at least one first buffering structure from the first support portion; and
    a handle, pivotably disposed on the base part.

21. The mount bracket according to claim 1, wherein the at least one positioning recess of the first side plate is formed by an inner bottom surface and two inner side surfaces connected to and perpendicular to the inner bottom surface, and the first buffering structure is a curved protrusion.

22. The server according to claim 14, wherein the at least one positioning recess of the first side plate is formed by an inner bottom surface and two inner side surfaces connected to and perpendicular to the inner bottom surface, and the first buffering structure is a curved protrusion.

23. The storage device assembly according to claim 20, wherein the at least one positioning recess of the first side plate is formed by an inner bottom surface and two inner side surfaces connected to and perpendicular to the inner bottom surface, and the first buffering structure is a curved protrusion.

\* \* \* \* \*